Dec. 19, 1939. J. E. PARKER Re. 21,305
APPARATUS FOR AMPLIFYING ELECTRICAL CURRENTS
Original Filed March 12, 1924
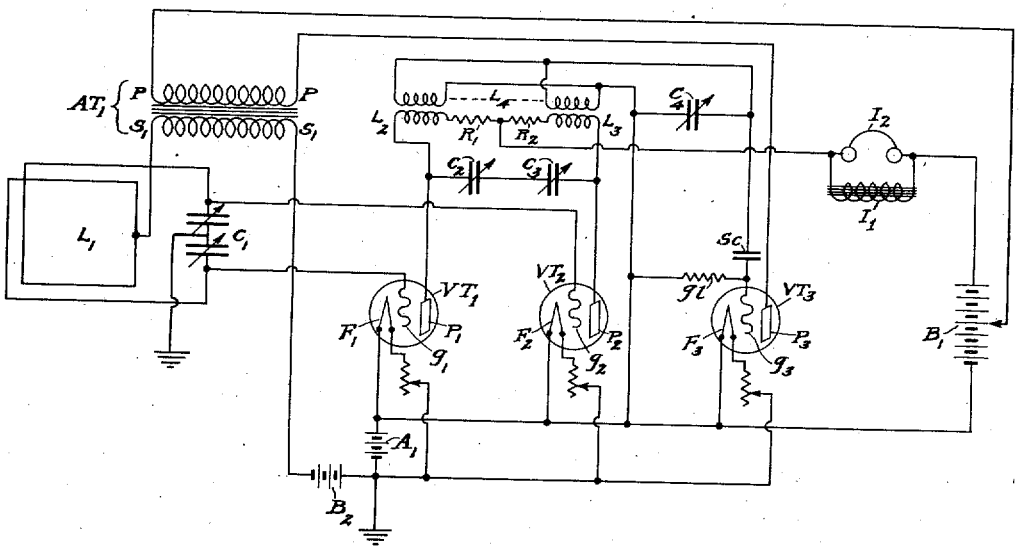
Inventor
James E. Parker
Attorney Reissued Dec. 19, 1939

Re. 21,305

UNITED STATES PATENT OFFICE 21,305

APPARATUS FOR AMPLIFYING ELECTRICAL CURRENTS

James E. Parker, Washington, D. C.

Original No. 1,672,037, dated June 5, 1928, Serial No. 698,680, March 12, 1924. Application for reissue May 28, 1930, Serial No. 456,741

20 Claims. (Cl. 250—20)

While my invention relates generally to the amplification of electrical currents it has for a particular object the amplification of high frequency electrical currents modulated at low or audible frequency. Modulations at audible frequency are variations of the envelope of the high frequency currents, said variations having a frequency within the audible range, while modulations at low frequency are variations of the envelope of the high frequency currents having any frequency below the audible range.

Heretofore when the same amplifying devices have been used for the dual function of amplifying high frequency currents and low or audible frequency currents, as for example in the well known reflex circuits, a difference of potential at high frequency existed between the points where the low or audible frequency currents were returned to the high frequency circuit. This enabled a high frequency potential to work back through the return path of the low or audible frequency currents into the rectifier. Since the impedance of this return path was always substantially different from that of the intended path for the high frequency currents, there were present in the rectifier two high frequency potentials of the same frequency but differing in phase. This out of phase relation resulted in a substantial modification of the envelope of the high frequency currents present in the rectifier so that the output of the rectifier was not a faithful reproduction of the envelope of the high frequency currents as received by the system.

A particular object of the invention is the efficient amplification of the currents at high frequency and having so amplified the currents to reduce them to low or audible frequencies and further amplify the low or audible frequency currents in the presence of the high frequency currents, using the same amplifying devices for the dual function.

My invention will be best understood by reference to the accompanying drawing in which it is illustrated in the figure employed as an amplifier in a receiving system for radio.

$L_1$ represents a coil or loop receiver having a capacity tuning arrangement illustrated by $C_1$. As the capacity $C_1$ I preferably employ an air condenser having two sets of fixed plates and one set of movable plates. The movable plates are controlled by one shaft and since these plates are of a low potential at all times, I have grounded them as shown in order to eliminate any stray capacity effects in the manipulation of the tuning of the resonant circuit. Two three-electrode vacuum tubes $VT_1$ and $VT_2$ have their grids $g_1$ and $g_2$ connected to opposite sides of the capacity $C_1$. The grounded filament lead to these tubes is connected to approximately the mid point of the coil $L_1$ through the secondary $S_1$ of a low or audible frequency transformer $AT_1$. This lead also includes a biasing battery $B_2$ to apply a negative potential to the grids of the vacuum tubes of a chosen value to obtain efficient amplification. The plate circuits of tubes $VT_1$ and $VT_2$ are supplied with a source of energy $B_1$ which causes currents to flow through choke coil $I_1$ and telephone receiver $I_2$, resistances $R_1$ and $R_2$, tuned circuit consisting of inductances $L_2$ and $L_3$ with condensers $C_2$ and $C_3$, and through plates $P_1$ and $P_2$ back to filaments $F_1$ and $F_2$ to battery $B_1$. Inductively coupled to tuned circuit $L_2$, $L_3$, $C_2$ and $C_3$ is another tuned circuit containing inductances $L_4$ and condenser $C_4$. One side of this tuned circuit is connected to filament $F_3$ of a vacuum tube $VT_3$ and the other side to the grid $g_3$. The vacuum tube $VT_3$ is connected for rectification, having stopping condenser SC and grid leak *gl* and not including a biasing potential on the grid. The plate $P_3$ of this tube is connected to the source of energy $B_1$ through the primary P of low or audio frequency transformer $AT_1$, and the circuit is completed through the filament $F_3$. The plate circuit connection to the battery $B_1$ is shown as variable as the detector or rectifying tube does not require as much plate potential as do the amplifying tubes $VT_1$ and $VT_2$. The filaments of the tubes are supplied with heating current from the battery $A_1$ in the usual manner. The condensers $C_2$ and $C_3$ are preferably constructed as described in connection with capacity $C_1$. The choke coil $I_1$ is not essential but I find it preferable to permit a larger current flow in the plate circuit of the vacuum tubes $VT_1$ and $VT_2$ than is ordinarily obtainable through the impedance of telephones or loud speaking devices $I_2$. It is not essential to employ a tuned coupling between the plate circuits of vacuum tubes $VT_1$ and $VT_2$ and the grid circuit of the vacuum tube $VT_3$ the tuned coupling I have shown being replaceable by an ordinary radio frequency transformer or other suitable transfer device, but such devices are not as selective as the tuned coupling I have shown. The resistances $R_1$ and $R_2$ are for the purpose of restricting the tendency of the vacuum tubes to create oscillations in tuned circuits, and these resistances should be chosen of such value as to just overcome this tendency so as not to destroy the amplitude of the amplified currents.

The operation of the system is as follows:

Signals are received on tuned circuits $L_1C_1$ acting as a collector. The signal currents being of an oscillatory nature charge grids $g_1$ and $g_2$ of the amplifier tubes $VT_1$ and $VT_2$ alternately with equal and opposite potentials. By means of the biasing battery $B_2$ the grids are worked at the most efficient potential for amplification according to my invention. The highly amplified currents are joined in the common plate circuit through the connection between the inductances $L_2$ and $L_3$. This amplified current is in its high frequency form and is transferred to the detector tube $VT_3$ by inductive coupling between coils $L_2$ and $L_3$ and resonant circuits $L_4C_4$. In the vacuum tube $VT_3$ the amplified currents are converted into low or audible frequency currents through the rectifying action of the tube and its connections, these low or audible frequency currents being characteristic of the modulations in the high frequency currents. The low or audible frequency currents flowing through the plate circuit of the detector tube $VT_3$ also flow through the primary of the low or audio frequency transformer $AT_1$ and induce current in the secondary $S_1$ of this transformer.

As has been previously pointed out the grounded filament lead to the tubes $VT_1$ and $VT_2$ is connected to approximately the midpoint of the coil $L_1$. This point of connection is a nodal point. There therefore exists no high frequency potential between the point of connection with the coil $L_1$ and the grounded filament lead. In other words no high frequency potential exists across the transformer $AT_1$. It follows that no high frequency potential can work back through the leads from the primary P of the transformer $AT_1$ to the rectifier tube $VT_3$. Thus the high frequency potential present in the rectifier tube $VT_3$ is only that which has reached the tube $VT_3$ through the intended path including the tubes $VT_1$, $VT_2$ and the resonant circuit $L_4C_4$. When a high frequency potential exists across the transformer $AT_1$, or its equivalent in the usual reflex circuit, a substantial high frequency potential will work back into the rectifier tube because the impedance of this alternate path, although designed for other than high frequency, is, nevertheless, due to distributed capacity or other causes sufficiently low, to allow the passage of enough high frequency potential to effect the rectifier undesirably. It should furthermore be noted that it requires but a slight high frequency potential out of phase with the desired high frequency potential to substantially modify the envelope of the high frequency potential present in the detector.

With the present invention the output of the detector tube $VT_3$ is a faithful reproduction of the envelope of the high frequency currents as received by the system. The mathematical analysis will show that with suitable transformer connections the potential induced in the transformer $AT_1$ by the low or audio frequency currents, neglecting certain higher harmonics, is in phase with the change of the internal resistance of the tube $VT_3$ which in turn is in phase with the envelope of the incoming high frequency currents.

There is thus present in the transformer $AT_1$ a low or audible frequency voltage in phase with the envelope of the incoming high frequency signals. This low or audible frequency voltage is applied to the grids $g_1$ and $g_2$ of the tubes $VT_1$ and $VT_2$ causing the average potential of the grids $g_1$ and $g_2$ to rise and fall together and in phase with the envelope of the incoming high frequency currents.

With the grids of tubes $VT_1$ and $VT_2$ normally biased by means of battery $B_2$ to the potential most efficient for amplification, it is apparent that any low or audio frequency potential supplied by means of the transformer $AT_1$ is either added to or subtracted from the potential normally applied to the grids $g_1$ and $g_2$ thus causing the potential of these grids to depart from the potential most efficient for amplification. The result of this action is to decrease the strength of the high frequency output of tubes $VT_1$ and $VT_2$ responsive to a strong signal while permitting the amplifier to work at maximum efficiency when very weak signals are being received.

It is further obvious that the voltage returned to the high frequency circuit through the transformer $AT_1$ may be either of low frequency or of audible frequency according to the chosen impedance characteristic of the transformer $AT_1$, and that, if the high frequency currents are modulated at a frequency other than a low or audible frequency, as herein defined, my invention may be practiced in that case also by a suitable choice of the impedance characteristics of the transformer $AT_1$.

It will also be noted that while I have shown, in my preferred embodiment, the grounded filament lead to tubes $VT_1$ and $VT_2$ connected to a nodal point of the coil $L_1$, it is obvious to those skilled in the art that the benefits of my invention may still be realized if the connection be removed from the nodal point, the benefits however being inversely proportionate to the degree of removal.

Having described my invention I claim:

1. The method of amplifying high frequency electrical currents modulated at audible frequencies which consists of converting the high frequency currents into a plurality of high frequency currents out of phase with each other, amplifying these high frequency currents in two parallel vacuum tube circuits, combining the amplified currents, reducing the combined currents to audible frequency currents corresponding to the modulations of the high frequency currents, transferring the audible frequency currents to the radio frequency circuits and amplifying said audible frequency currents through the high frequency amplifying circuits.

2. The method of reducing high frequency electrical currents modulated at low frequencies to amplified low frequency currents characteristic of said modulations which consists of converting the said high frequency currents into opposite currents differing 180 degrees in phase with each other, employing the alternating high frequency potentials of said converted currents to produce amplified high frequency currents, combining the amplified currents, reducing the resultant amplified currents to low frequency currents corresponding to the modulations thereof, and amplifying said low frequency currents corresponding to the modulations thereof, and amplifying said low frequency currents simultaneously with the amplification of subsequent high frequency currents.

3. In a system for receiving and amplifying electrical currents a pair of three electrode vacuum tubes, means for receiving high frequency electrical currents, means for converting the said high frequency currents into opposite currents differing in phase with each other, means for applying the varying potentials of said opposite currents to the grids of said tubes, means for combining the resultant plate currents of said tubes, means for rectifying said combined currents to produce low frequency currents, and means for returning said low frequency currents to said vacuum tubes for further amplification in low frequency form.

4. In a system for receiving and amplifying electrical currents a pair of three electrode vacuum tubes, means for receiving high frequency electrical currents, means for converting the said high frequency currents into opposite currents differing 180 degrees in phase with each other, means for applying the varying potentials of said opposite currents to the grids of said tubes, means for combining the resultant plate currents of said tubes, means for rectifying said combined currents to produce low frequency currents and means for returning said low frequency currents to said vacuum tubes for further amplification in low frequency form.

5. In a receiving and amplifying system including a plurality of vacuum tubes having filaments, grids and plates and sources of power therefor, the combination of an input coil having a central tap, one terminal of the input coil connected to the grid of one vacuum tube, the other terminal of the input coil connected to the grid of a second vacuum tube, a tuning condenser in parallel with the input coil, a connection between the central tap of the input coil and the filaments of the vacuum tubes including the secondary of an audio transformer, the plates of the first and second vacuum tube connected together through an inductance, a tuning condenser in parallel with the inductance, a tap centrally located with respect to the terminals of the inductance, a connection from the tap through an indicating device and a source of plate power to the filaments of the vacuum tubes, an inductance coupled to the inductance in the plate circuits of the first and second vacuum tubes, a tuning condenser for this inductance, one terminal of this inductance coupled to the grid of a third vacuum tube functioning as a detector, the other terminal of this inductance connected to the filaments of the vacuum tubes and the plate of the detector tube connected through the primary of the audio frequency transformer and the source of plate power to the filaments of the vacuum tube.

6. In a receiving and amplifying system including a plurality of vacuum tubes having filaments, grids and plates and sources of power therefor, the combination of an input coil having a central tap, one terminal of the input coil connected to the grid of one vacuum tube, the other terminal of the input coil connected to the grid of a second vacuum tube, a plurality of tuning condensers in parallel with the input coil, a connection between the central tap of the input coil and the filaments of the vacuum tubes including the secondary of an audio transformer, the plates of the first and second vacuum tube connected together through a plurality of inductances, a plurality of tuning condensers in parallel with the inductances, a tap between the inductances, a connection from the tap through an indicating device and a source of plate current to the filaments of the vacuum tubes, a plurality of inductances coupled to the inductances in the plate circuits of the first and second vacuum tubes, a tuning condenser for these inductances, one terminal of these inductances coupled to the grid of a third vacuum tube functioning as a detector, the other terminal of these inductances connected to the filaments of the vacuum tubes and the plate of the detector tube connected through the primary of the audio frequency transformer and the source of plate power to the filaments of the vacuum tubes.

7. In a receiving and amplifying system including a plurality of vacuum tubes having filaments, grids and plates and sources of power therefor, the combination of an input coil having a central tap, one terminal of the input coil connected to the grid of one vacuum tube, the other terminal of the input coil connected to the grid of a second vacuum tube, a plurality of tuning condensers in parallel with the input coil, the central element of the tuning condensers being grounded, a connection between the central tap of the input coil and the grounded filaments of the vacuum tubes including the secondary of an audio transformer, the plates of the first and second vacuum tubes being connected together through an inductance, a tuning condenser in parallel with the inductance, a tap centrally located with respect to the terminals of the inductance, a connection from the tap through an indicating device and a source of plate current to the filaments of the vacuum tubes, an inductance coupled to the inductance in the plate circuits of the first and second vacuum tubes, a tuning condenser for this inductance, one terminal of this inductance coupled to the grid of a third vacuum tube functioning as a detector, the other terminal of this inductance connected to the filaments of the vacuum tubes and the plate of the detector tube connected through the primary of the audio frequency transformer and the source of plate power to the filaments of the vacuum tubes.

8. In a receiving and amplifying system including a plurality of vacuum tubes having filaments, grids and plates and source of power therefor, the combination of an input coil having a central tap, one terminal of the input coil connected to the grid of one vacuum tube, the other terminal of the input coil connected to the grid of a second vacuum tube, a tuning condenser in parallel with the input coil, a connection between the central tap of the input coil and the filaments of the vacuum tubes including the secondary of an audio transformer, the plates of the first and second vacuum tubes being connected together through an inductance, two resistances and a second inductance, a plurality of tuning condensers in parallel with the inductances and resistances, a tap between the resistances, a connection from the tap through an indicating device and a source of plate current to the filaments of the vacuum tubes, a plurality of inductances coupled to the inductances in the plate circuits of the first and second vacuum tubes; a tuning condenser for these inductances, one terminal of these inductances coupled to the grid of a third vacuum tube functioning as a detector, the other terminal of these inductances connected to the filaments of the vacuum tubes and the plate of the detector tube connected through the primary of the audio frequency transformer and the source of plate power to the filaments of the vacuum tubes.

9. In a reflex system including high frequency and low frequency circuits, means for eliminating the flow of high frequency current between the points in the high frequency circuit at which the low frequency potential is returned to the high frequency circuit.

10. In a reflex circuit including a reflex coupling, means for eliminating the flow of high frequency currents between the points at which said coupling is connected to the high frequency circuit.

11. In a system for receiving and amplifying electrical currents a circuit responsive to a high frequency, a circuit responsive to a lower frequency, a reflex coupling between said circuits, and means for eliminating the flow of high frequency currents between the points in said circuit responsive to a high frequency at which the circuit responsive to a lower frequency is connected.

12. In a receiving and amplifying system, a high frequency circuit, a rectifier circuit therefor, a reflex coupling between said rectifier circuit and said high frequency circuit, and means for eliminating the flow of high frequency between the points in said high frequency circuit at which the reflex coupling is connected to the high frequency circuit.

13. In a system for receiving and amplifying electrical currents having an envelope with definite frequency characteristics, a circuit for receiving said electrical currents, means for amplifying said currents, means for deriving from said electrical currents a voltage proportionate to said frequency characteristics, and means for impressing said voltage upon said circuit between substantially nodal points in said circuit.

14. In a system for receiving and amplifying electrical currents including a high frequency circuit, a rectifier circuit therefor, a reflex coupling between said circuits and means for preventing high frequency current flow between the points in said high frequency circuit to which said coupling is reflexed and thereby preventing said currents from entering the rectifier circuit through said coupling.

15. In a receiving and amplifying system, a plurality of circuits in cascade relation, means for applying the potentials of one of said circuits to a preceding circuit between substantially nodal points in said preceding circuit.

16. In a receiving and amplifying system of the reflex type, a plurality of thermionic tubes connected in push-pull relation for amplifying the received currents, and means for applying reflexed currents to said tubes in parallel relation for amplifying the reflexed currents.

17. In a receiving and amplifying system of the reflex type, a plurality of thermionic tubes connected in push-pull relation for amplifying the received currents, and means for applying the reflexed currents to said tubes between substantially nodal points said means connecting said tubes to function in parallel relation for amplifying said reflexed currents.

18. In a system for receiving and amplifying electrical currents having an envelope with definite frequency characteristics, a plurality of thermionic tubes, means connected in push-pull relation for amplifying the received currents, means for deriving from the amplified currents a voltage proportionate to said frequency characteristics, and connections whereby said tubes will operate in parallel relation for amplifying said derived voltage.

19. In a receiving and amplifying system of the reflex type, a plurality of thermionic tubes connected in push-pull relation for amplifying received radio frequency currents, means connected in the output of said amplifier for detecting said radio frequency currents, and means for applying the detected component to said thermionic tubes in parallel relation.

20. In a receiving and amplifying system of the reflex type, a plurality of thermionic tubes connected in push-pull relation for amplifying the received currents, means for detecting the amplified currents, means for applying the detected currents to the tubes between substantially nodal points, and means for connecting said tubes to function in parallel relation for amplifying the detected currents.

JAMES E. PARKER.